(12) United States Patent
Kim et al.

(10) Patent No.: US 7,839,086 B2
(45) Date of Patent: Nov. 23, 2010

(54) DISPLAY DEVICE AND METHOD FOR MANUFACTURING THE SAME

(75) Inventors: Sang Dae Kim, Daegu (KR); Jung Hwan Lee, Daegu (KR); Ho Won Choi, Gumi-si (KR)

(73) Assignee: LG Electronics Inc., Seoul (KR)

( * ) Notice: Subject to any disclaimer, the term of this patent is extended or adjusted under 35 U.S.C. 154(b) by 789 days.

(21) Appl. No.: 11/701,419

(22) Filed: Feb. 2, 2007

(65) Prior Publication Data
US 2008/0088231 A1    Apr. 17, 2008

(30) Foreign Application Priority Data
Oct. 12, 2006    (KR) ............... 10-2006-0099393

(51) Int. Cl.
*H05B 33/22* (2006.01)

(52) U.S. Cl. ........................ 313/509; 445/24

(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

U.S. PATENT DOCUMENTS

| | | | |
|---|---|---|---|
| 5,958,610 A * | 9/1999 | Yonekawa et al. | 428/690 |
| 7,388,225 B2 * | 6/2008 | Fukuhara et al. | 257/59 |
| 2001/0049153 A1 * | 12/2001 | Tanaka | 438/29 |
| 2004/0027064 A1 | 2/2004 | Tanabe et al. | |
| 2005/0007016 A1 | 1/2005 | Mori | |
| 2005/0067952 A1 | 3/2005 | Fechter et al. | |
| 2005/0093439 A1 * | 5/2005 | Harada et al. | 313/506 |
| 2005/0212410 A1 * | 9/2005 | Su | 313/504 |
| 2006/0043888 A1 * | 3/2006 | Nakagawa et al. | 313/506 |
| 2006/0082285 A1 * | 4/2006 | Wu et al. | 313/503 |
| 2006/0163565 A1 * | 7/2006 | Park et al. | 257/40 |
| 2006/0181199 A1 | 8/2006 | Lee et al. | |
| 2006/0208632 A1 * | 9/2006 | Kang | 313/503 |

FOREIGN PATENT DOCUMENTS

EP    0 493 975    7/1992

(Continued)

OTHER PUBLICATIONS

European Search Report dated Oct. 5, 2007.

(Continued)

*Primary Examiner*—Nimeshkumar D Patel
*Assistant Examiner*—Donald L Raleigh
(74) *Attorney, Agent, or Firm*—KED & Associates, LLP

(57) ABSTRACT

An electroluminescent device may be provided that includes a substrate, a first electrode provided on the substrate, a light emitting layer provided on the first electrode, and a first metal layer provided on the light emitting layer. An oxide layer may also be provided at an interface of the first metal layer and a conductive particle. Other embodiments as described herein may also be provided.

23 Claims, 12 Drawing Sheets

FOREIGN PATENT DOCUMENTS

| | | |
|---|---|---|
| JP | 2001-189191 | 7/2001 |
| JP | 2004-119029 | 4/2004 |
| JP | 2005-044799 | 2/2005 |
| JP | 2005-50706 | 2/2005 |
| KR | 10-2005-0031989 | 4/2005 |
| KR | 10-2006-0091648 | 8/2006 |
| KR | 10-2007-0025253 | 3/2007 |
| WO | WO 01/15496 | 3/2001 |

OTHER PUBLICATIONS

Korean Office Action dated Jul. 7, 2007.
Chinese Office Action dated Feb. 6, 2009 and English language translation.
Korean Notice of Allowance dated Jun. 25, 2007 and English-language translation.

* cited by examiner

DL1, DL2 ··· DLm

US 7,839,086 B2

DISPLAY DEVICE AND METHOD FOR MANUFACTURING THE SAME

This application claims priority from Korean Patent Application No. 10-2006-000099393, filed on Oct. 12, 2006, the subject matter of which is incorporated herein by reference.

BACKGROUND

1. Field

Embodiments of the present invention may relate to a display device and/or a method for manufacturing a display device. More specifically, embodiments of the present invention may relate to a display device and/or a method for manufacturing a display device that may prevent current leakage from a cathode electrode and/or reduce resistance of the cathode electrode.

2. Background

Various types of flat panel displays have been developed with reduced weight and bulk that are free from disadvantages of cathode ray tubes (CRT). Such flat panel displays include a liquid crystal display (LCD), a field emission display (FED), a plasma display panel (PDP) and an electroluminescence (EL) display device.

BRIEF DESCRIPTION OF THE DRAWINGS

Arrangements and embodiments of the present invention may be better understood with reference to the following description, claims and accompanying drawings in which like refer to like elements and wherein:

DETAILED DESCRIPTION

Embodiments of the present invention may be described in detail with reference to the accompanying drawings. In the following embodiments, an organic electroluminescent device may be provided as one example of a light emitting device. However, embodiments of the present invention are not limited to an organic electroluminescent device.

Figure 1:
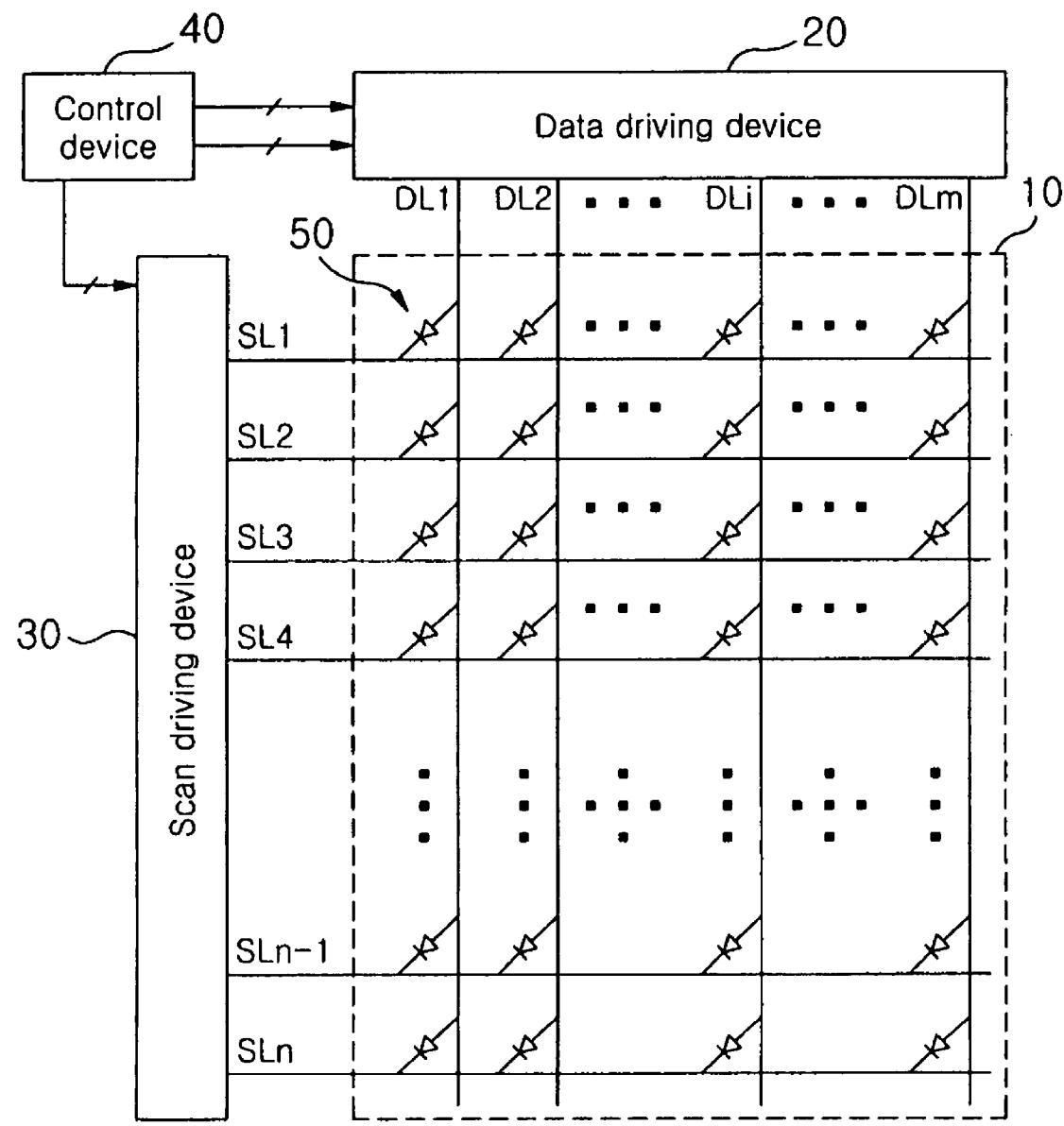
FIG. 1 is a block diagram of a display apparatus according to an example arrangement.

FIG. 1 is a block diagram of a display apparatus according to an example arrangement. Other arrangements may also be provided such as, for example, in U.S. patent application Ser. No. 10/858,387 (Publication No. 2004-222749), Ser. No. 11/858,387 (Publication No. 2004-222749), Ser. No. 11/318,515 (Publication No. 2006-146827) and Ser. No. 11/289,644 (Publication No. 2006-119256), etc, whose entire disclosures are incorporated herein by reference. A display apparatus may be used in or formed as a rigid or flexible display for electronic books, newspapers, magazines, etc. The display apparatus may also be used in various types of portable devices (e.g., handsets, MP3 players, notebook computers, etc.), audio applications, navigation applications, televisions, monitors, or other types of devices that use a display, either monochrome or color.

FIG. 1 shows that the display apparatus may include a panel 10, a data driving device 20, a scan driving device 30 and a control device 40. The panel 10 may also include a plurality of pixels 50 formed in cross areas of data lines (DL1 to DLm) and scan lines (SL1 to SLn).

Figure 2:
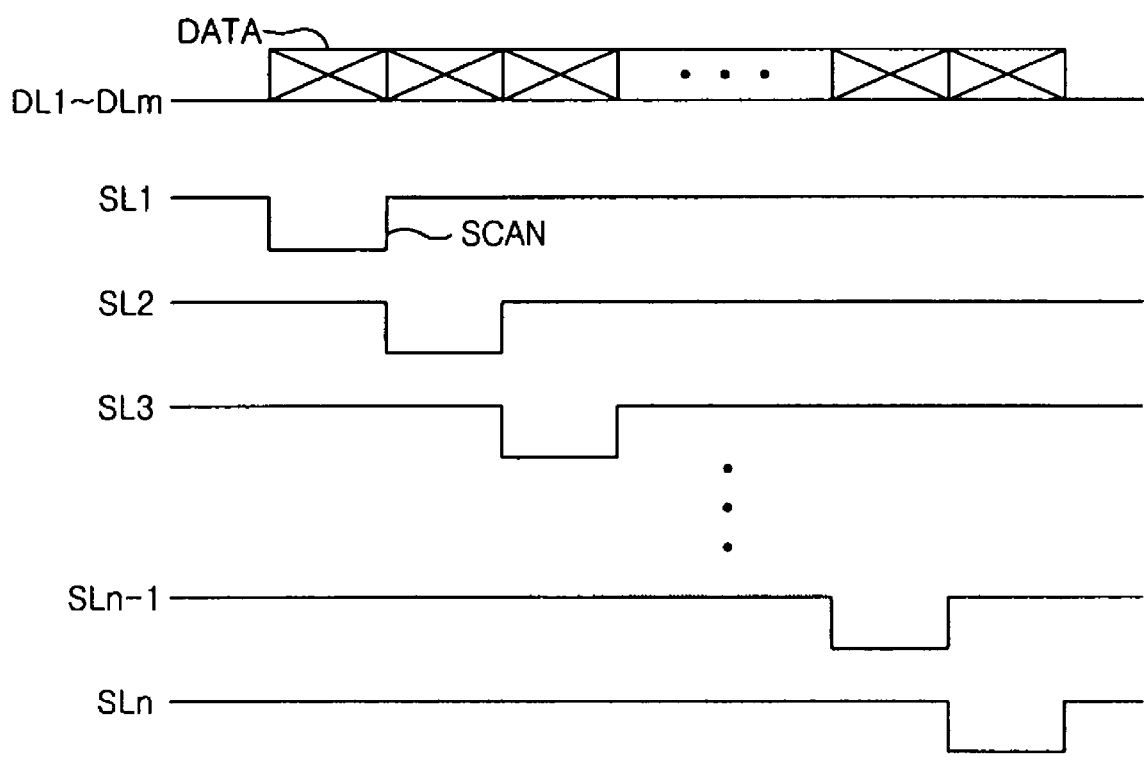
FIG. 2 is a timing diagram showing one example of scan signals being applied to scan lines according to an example arrangement.

The scan driving device 30 may transmit scan signals in sequence to the scan lines (SL1 to SLn). The data driving device 20 may transmit data signals in sequence to the data lines (DL1 to DLm). The data driving device 20 may use a pulse amplitude modulation (PAM) method or a pulse width modulation (PWM) method, for example, to apply the data signals to the data lines (DL1 to DLm). For example, FIG. 2 is a timing diagram showing one example of scan signals being applied to the scan lines by the scan driving device 30 and data signals being applied to the data lines by the data driving device 20.

Figure 3:
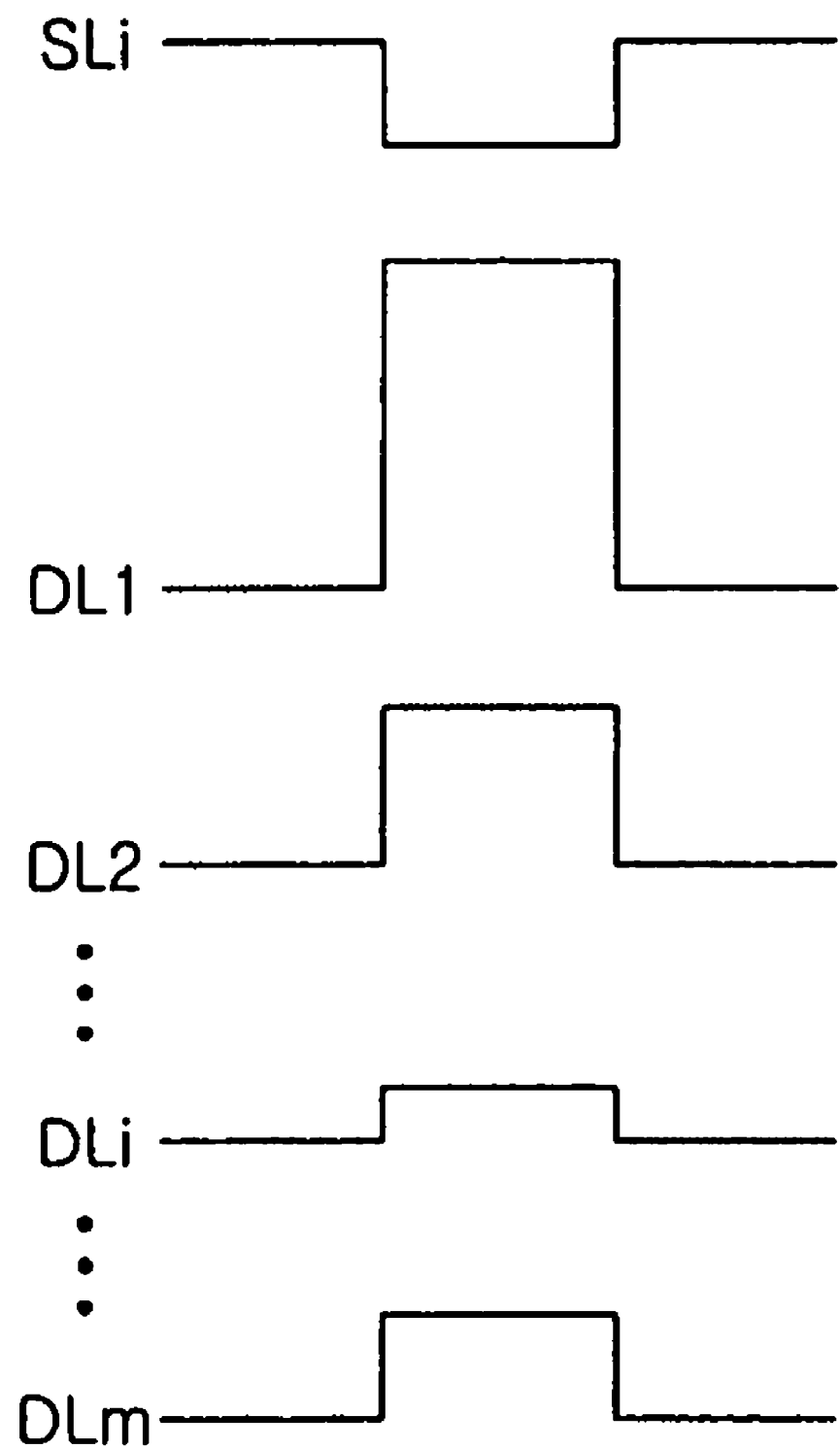
FIG. 3 is a timing diagram showing a method of driving a panel using a pulse amplitude modulation (PAM) method.

FIG. 3 is a timing diagram showing a method of driving the panel 10 using a PAM method. The data driving device 20 may apply data signals (i.e., data current corresponding to the digital video data) to the data lines (DL1 to DLm) by using the PAM method. In the PAM method, a gray scale of the pixels may be proportionate to an amplitude of the data current. In the data current, a time to have high logic may be constant irrespective of the gray scale corresponding to the digital video data. Similar driving methods are disclosed in U.S. patent application Ser. No. 11/318,515 (Publication No. 2006-146827), etc, whose entire disclosure is incorporated herein by reference.

Figure 4:
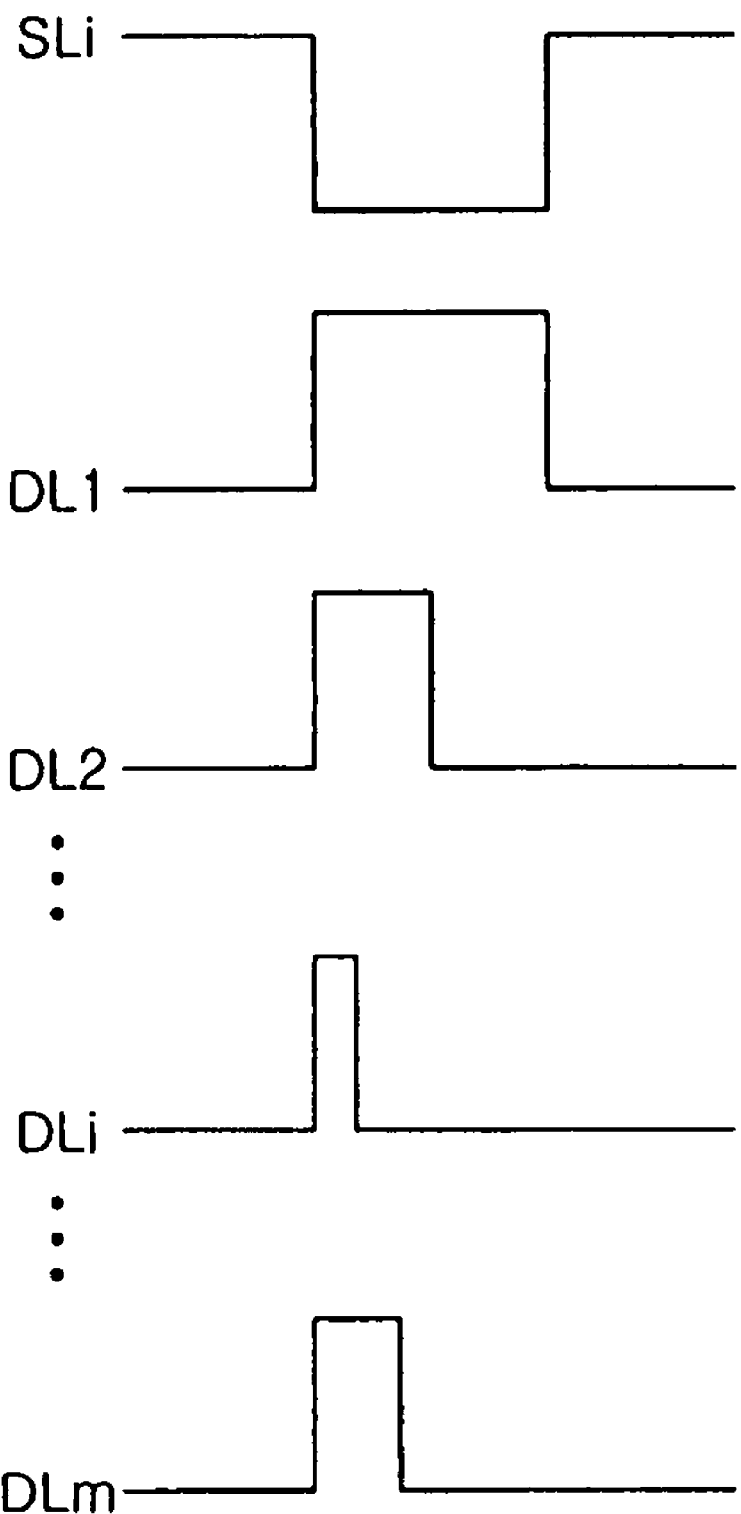
FIG. 4 is a timing diagram showing a method of driving a panel using a pulse width modulation (PWM) method.

FIG. 4 is a timing diagram showing a method of driving the panel 10 using a PWM method. The data driving device 20 may apply data signals (i.e., data current corresponding to the digital video data) to the data lines (DL1 to DLm) by using the PWM method. In the PWM method, a gray scale of the pixels may be proportionate to a time of high logic in the data current. The amplitude of the data current may be constant irrespective of the gray scale corresponding to the digital video data. Similar driving methods are disclosed in U.S. patent application Ser. No. 11/318,515 (Publication No. 2006-146827), etc., whose entire disclosures is incorporated herein by reference.

The data driving device 20 use either a PAM current generating circuit and/or a PWM current generating circuit to drive the panel 10 depending on a gray scale level of an image signal as detected by the control device 40. When image signals having a relatively high gray scale level are to be displayed, the PAM method may be used to minimize power consumption. When image signals having a relatively low gray scale level are to be displayed, the PWM method may be used to ensure that good image quality is maintained. Other methods may also be used.

Figure 5:
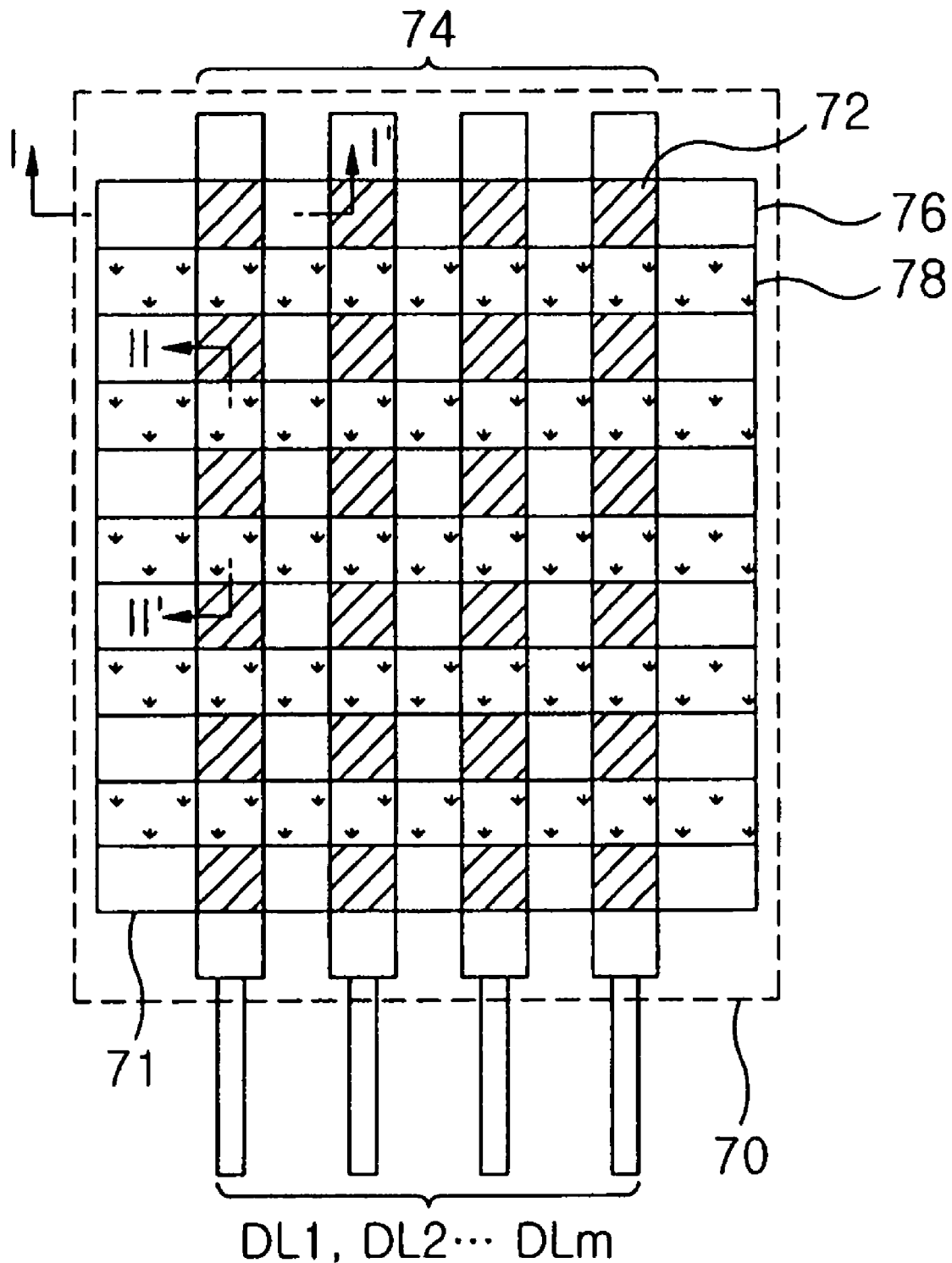
FIG. 5 shows a panel according to an example arrangement.

FIG. 5 shows a structure of a panel 10 according to an example arrangement. Other arrangements may also be used such as, for example, as illustrated in U.S. Pat. No. 6,897,471, etc., whose entire disclosure is incorporated herein by reference. More specifically, FIG. 5 shows a panel 70 corresponding to the panel 10 shown in FIG. 1. The panel 70 may include a cell section 71 containing a plurality of sub-pixels 72 (e.g., light emitting areas), anode electrode layers (or anode electrodes or data electrodes) 74, cathode electrode layers (or cathode electrodes or scan electrodes) 76 and walls 78. The sub-pixels 72 may be formed in cross areas of the anode electrode layers 74 and the cathode electrode layers 76.

The anode electrode layers 74 may serve as positive electrodes and the cathode electrode layers 76 may serve as negative electrodes. The walls 78 may be made of an insulating material to separate the cathode electrode layers 76 so that the cathode electrode layers 76 are not short-circuited.

The data lines DL1, DL2 . . . DLm may be conductors that are coupled to the anode electrode layers 74. Scan lines (not shown in FIG. 5) may be coupled to the cathode electrode layers 76. As one example, first scan lines may be connected to odd number cathode electrode layers and second scan lines may be connected to even number cathode electrode layers.

Figure 6:
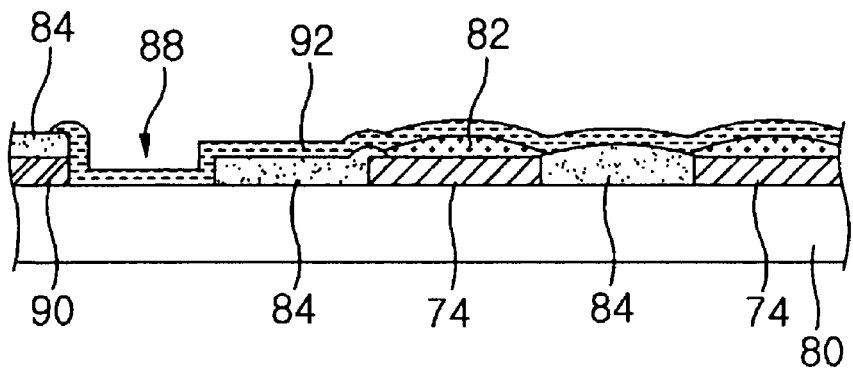
FIG. 6 is a side view of the panel according to an example arrangement.
Figure 7:
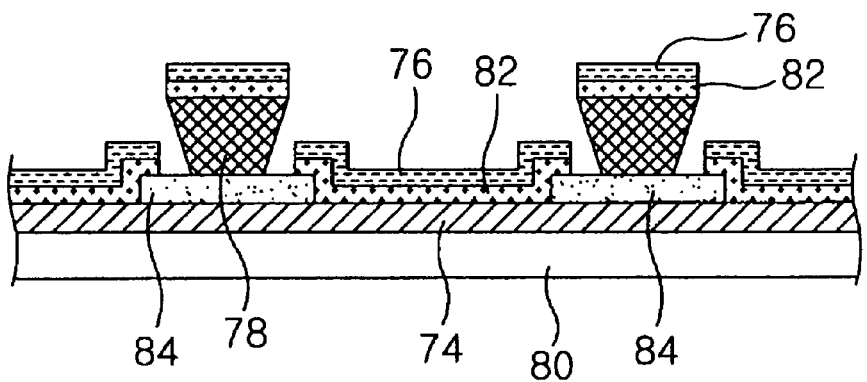
FIG. 7 is a side view of the panel according to an example arrangement.

FIGS. 6 and 7 are side views of an electroluminescent panel according to an example arrangement. More specifically, FIG. 6 is a sectional view taken along line I-I' of FIG. 5 and FIG. 7 is a sectional view taken along line II-II' of FIG. 5. Other arrangements may also be used.

FIG. 6 shows a substrate 80 having the anode electrode layers 74 and light emitting layer (or layers) 82 formed thereon in sequence. Each of the light emitting layers 82 may include an emitting layer made of organic or inorganic material corresponding to red, green or blue light, or a combination thereof.

An insulating layer 84 (or layers) may be formed on areas of the substrate 80 other than the light emitting areas and a contact hole section 88. The insulating layer 84 may prevent a short from occurring between the anode electrode layers 74. A scan line 90 may be connected to the contact hole section 88.

A metal layer 92 may be formed on the substrate 80 over the anode electrode layers 74, the insulating layer 84, the light emitting layer 82 and the scan line 90. The metal layer 92 may be connected to the scan line 90 through the contact hole section 88. The cathode electrode layers 76 (not shown in FIG. 6) may be connected to the scan line 90 through the contact hole section 88.

FIG. 7 shows that the anode electrode layer 74, the light emitting layer 82 and the cathode electrode layer 76 may be formed in sequence on the substrate 80. In addition, the insulating layers 84 and the wall 78 may be formed in sequence on the anode electrode layer 74.

Figure 8:
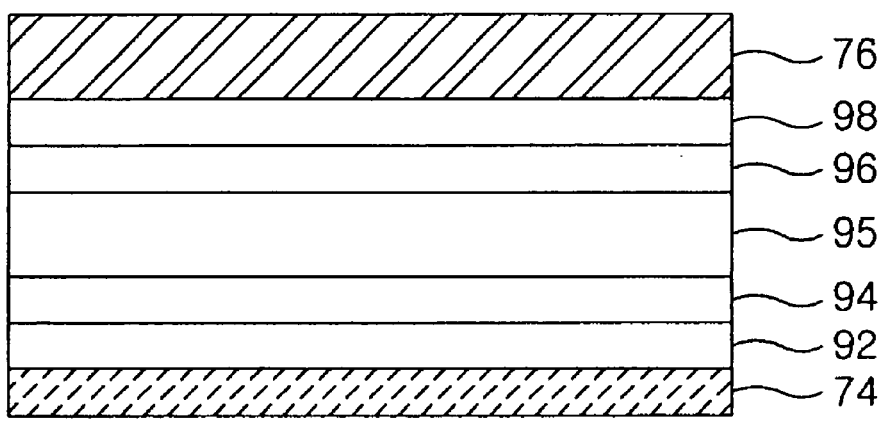
FIG. 8 shows an organic electroluminescent (EL) device according to an example arrangement.

FIG. 8 shows details of the light emitting device (e.g., an organic electroluminescent device) according to an example arrangement. Other arrangements may also be used such as, for example, as illustrated in U.S. Pat. Nos. 6,579,629, 6,614, 176, & 6,803,123, and U.S. patent application Ser. No. 11/102,358 (Publication No. 226767), etc., whose entire disclosures are incorporated herein by reference. The plurality of layers shown in FIG. 8 correspond to the light emitting layer 82 shown in FIGS. 6-7. More specifically, the device includes a hole injecting layer (HIL) 92 formed on the anode electrode 74, a hole transporting layer (HTL) 94 formed on the HIL 92, an organic electroluminescent layer 95 formed on the HTL 94, an electron transporting layer (ETL) 96 formed on the HTL 94 and an electron injecting layer (EIL) 98 formed on the ETL 96. The cathode electrode layer 76 may be formed on the ETL 96. One or more of the HIL, HTL, ETL and EIL may be omitted, depending on the particular device structure adopted. Further, an inorganic electroluminescent device may be used.

Still further, depending on the materials used for the cathode electrode, the anode electrode and/or the substrate, the electroluminescent device may emit light through a transparent cathode electrode, or through a transparent anode electrode and the substrate, or through both (i.e., bi-directional).

Arrangements and embodiments will now be described in more detail with respect to FIGS. 9-14.

Figure 9:
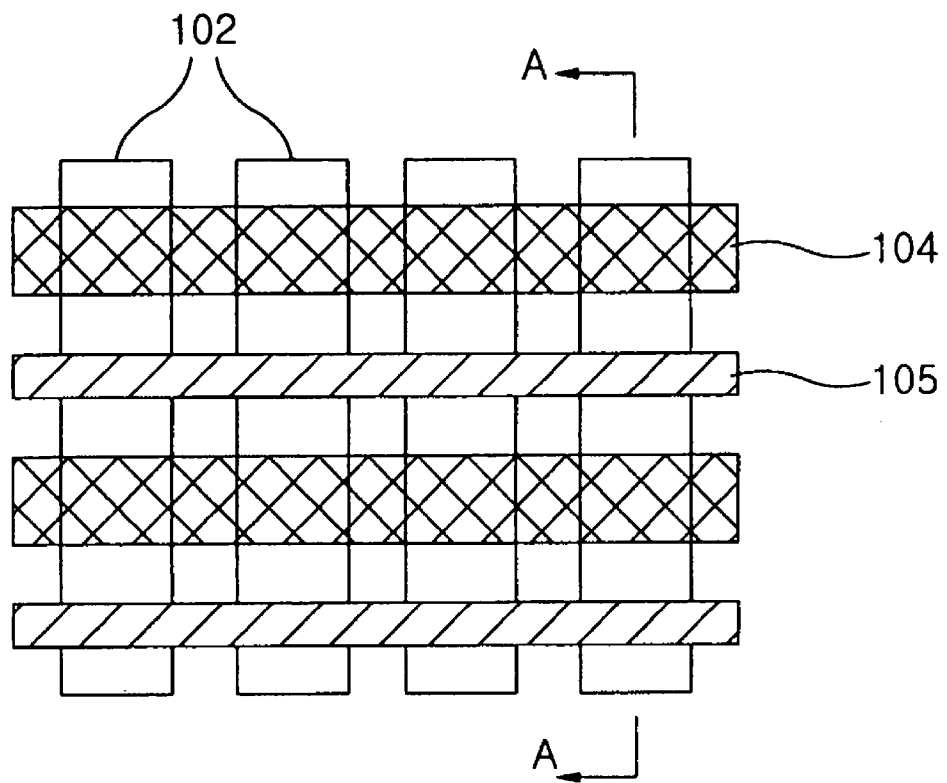
FIG. 9 is a plane view of a pixel circuit section of an organic electroluminescent device according to one example arrangement.
Figure 10:
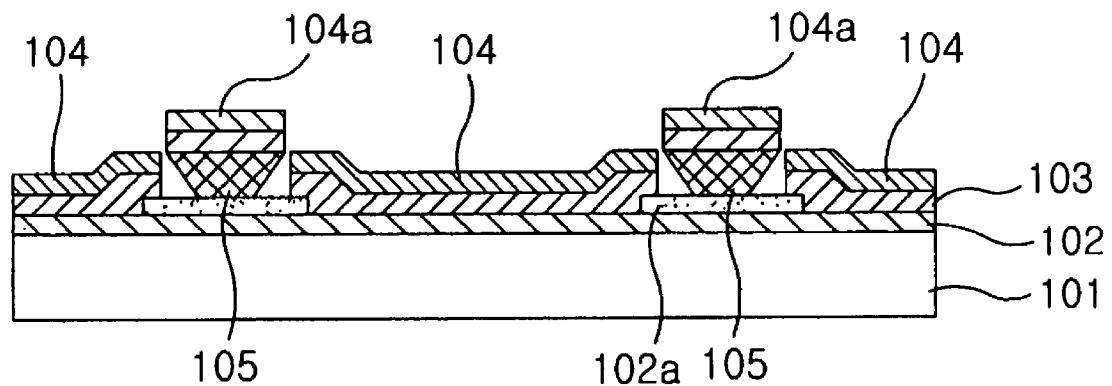
FIG. 10 is a sectional view taken along line A-A in FIG. 9.

FIG. 9 is a plane view of a pixel circuit section of an organic electroluminescent device according to one example arrangement. FIG. 10 is a sectional view taken along a line A-A in FIG. 9. FIGS. 9-10 schematically show a structure of the organic electroluminescent device. Other arrangements may also be used.

The organic electroluminescent device may include anode electrodes 102 arranged on a substrate 101, an organic electroluminescent light emitting layer 103 formed on the anode electrode 102 and cathode electrodes 104 formed on the organic electroluminescent light emitting layer 103. The anode electrodes 102 may be an ITO layer (or a flexible transparent layer). The cathode electrodes 104 may be a metal layer mainly formed of aluminum.

Each of the cathode electrodes 104 (including the organic electroluminescent light emitting layer 103) may be spaced apart from a neighboring cathode electrode(s) by a wall 105. FIG. 10 also shows an insulating layer 102*a* and a metal layer 104*a* formed on the wall 105 in a process of forming the cathode electrode 104.

After a plurality of pixel circuit sections having the structure shown in FIGS. 9-10 are formed on the substrate 101, individual organic electroluminescent devices may be formed by a metal wiring process (to the anode electrodes 102 and the cathode electrodes 104), a cap attaching process and a scribing process in each pixel circuit section.

Figure 11:
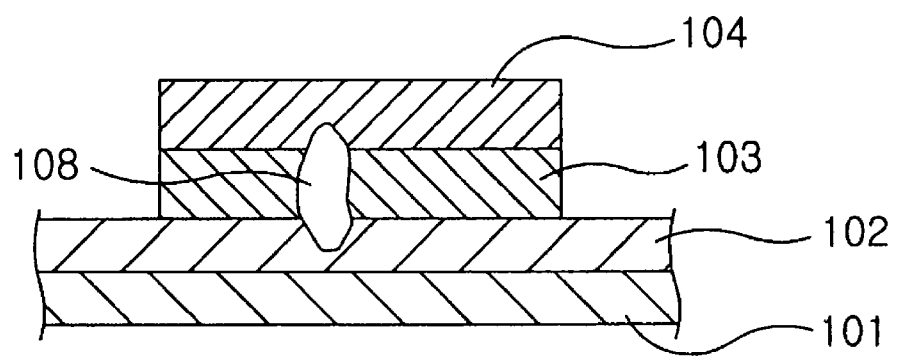
FIG. 11 is a partial enlarged sectional view of one cathode electrode and its understructure according to one example arrangement.

FIG. 11 is a partial enlarged sectional view of one cathode electrode 104 and its understructure according to one example arrangement. Other arrangements may also be used. The understructure may include the substrate 101 and the anode electrode 102. The cathode electrode 104 provided on the organic electroluminescent light emitting layer 103 may be made of metal, such as aluminum. The cathode electrode 104 may be referred to as a "metal electrode."

In the process of forming the organic electroluminescent light emitting layer 103, a conductive particle (or particles) 108 may be generated due to one factor. For example, the conductive particle 108 may be generated due to impurity particles existing in a process chamber. The particles 108 may exist in the organic electroluminescent light emitting layer 103. Additionally, the particles 108 may exist in the metal electrode 104 formed on the organic electroluminescent light emitting layer 103 after forming the metal layer.

As shown in FIG. 11, the conductive particle (or particles) 108 existing over the anode electrode 102, the organic electroluminescent light emitting layer 103 and the metal electrode 104 may be responsible for leakage current. Although no current should flow, a reverse voltage may be applied. However, if the conductive particle 108 exists then a current may flow through the metal electrode 104, the organic electroluminescent light emitting layer 103 and the anode electrode 102 due to the conductive particle 108.

Figure 12:
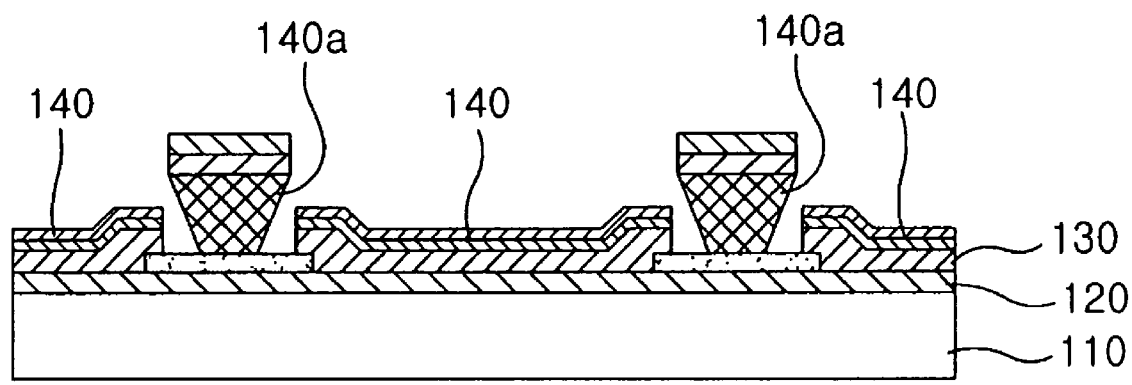
FIG. 12 is a sectional view showing a structure of an organic electroluminescent device according to an example of the present invention.
Figure 13A:
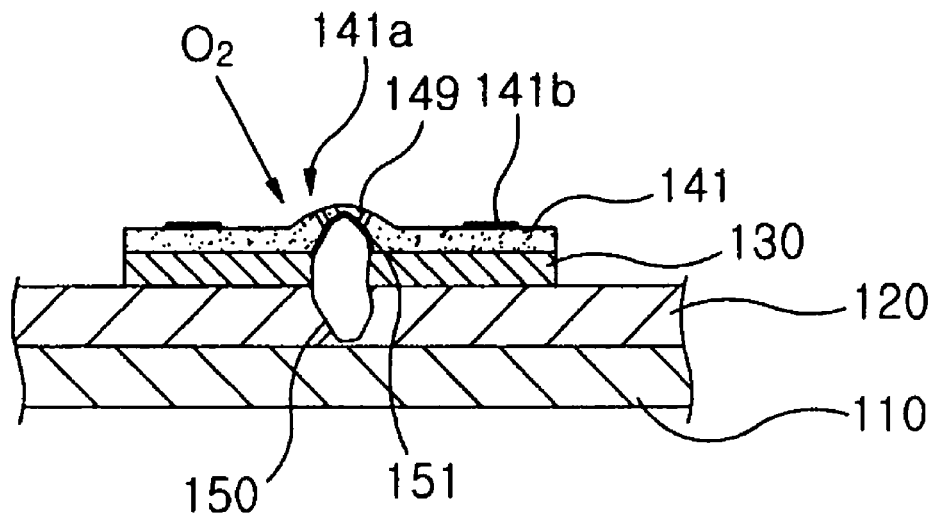
FIG. 13A and FIG. 13B are partial enlarged views showing (in sequence) a process of forming a cathode electrode according to an example embodiment of the present invention.
Figure 13B:
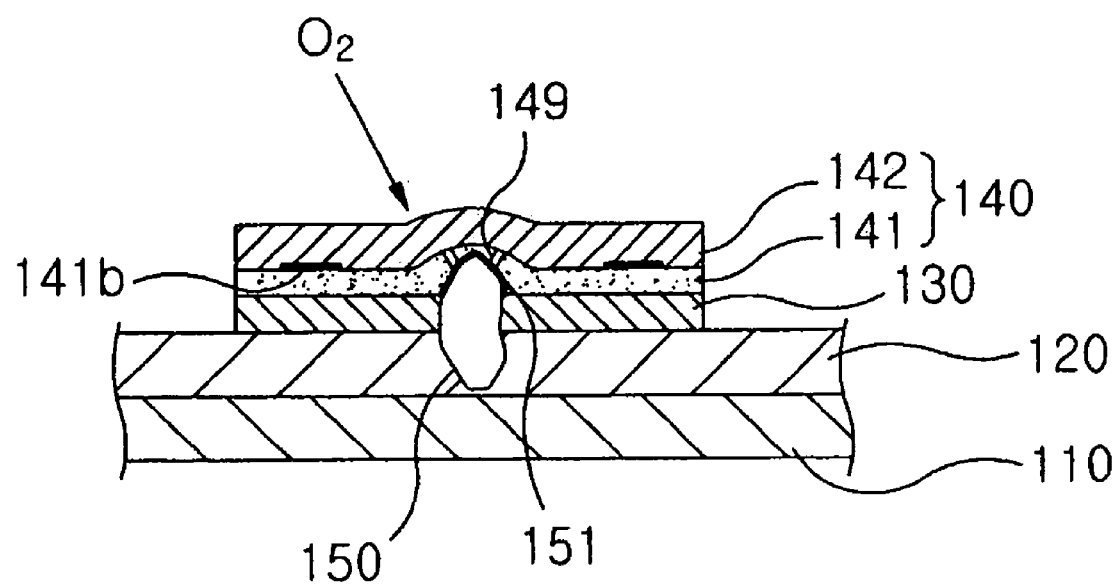

FIG. 12 is a sectional view showing a structure of an organic electroluminescent device according to an example embodiment of the present invention. FIG. 13A and FIG. 13B are partial enlarged views showing (in sequence) a process of forming a cathode electrode according to an example embodiment of the present invention. Other embodiments and configurations are also within the scope of the present invention. The cathode electrode 140 may hereinafter be referred to as "a metal electrode."

As shown in FIG. 13A, an anode electrode 120 and an organic electroluminescent light emitting layer 130 may be formed on a substrate 110. In a process of forming the organic electroluminescent light emitting layer 130, a conductive particle 150 may be generated such as due to impurity particles existing in a process chamber. The conductive particle 150 may also be provided due to other factors. The conductive particle 150 may exist in the organic electroluminescent light emitting layer 130. The organic electroluminescent light emitting layer may hereinafter be referred to as an organic EL layer 130.

In the process of manufacturing the organic electroluminescent device, it may be difficult to identify whether the conductive particle 150 exists in the structure. It may also be difficult to prevent generation of the conductive particle 150 during manufacturing.

An example embodiment of the present invention may solve a problem or problems that occur when a conductive particle exists in the structure (regardless of an actual existence of the conductive particle).

FIG. 13A shows a first metal layer 141 (i.e., a lower metal layer or a first conductive layer) formed on the organic EL layer 130 through a process of forming the metal layer in a vacuum chamber.

The first metal layer 141 may be formed through a thermal chemical vapor deposition process or an E-beam deposition process when covering the organic EL layer 130 and the conductive particle 150 existing on the organic EL layer 130. Other processes of forming the first metal layer 141 may also be used.

The substrate 110 may then be introduced into a chamber to perform a first oxidation process. The chamber in which the first oxidation process is performed may contain an inert gas in a range of 85% to 98% by volume and oxygen ($O_2$) in a range of 2% to 15% by volume. The inert gas may be argon, nitrogen or a mixture thereof, for example.

Once the oxidation process is performed (e.g., for 20 minutes) and/or during the oxidation process, oxygen may react with metal material constituting the first metal layer 141 formed around the conductive particle 150. An oxide layer 151 (or other types of insulating layer) may be formed on a portion 141a of the first metal layer 141 corresponding to the conductive particle 150. The oxide layer 151 may be adjacent to the first metal layer 141.

The oxidation reaction will now be described. In the first metal layer 141 formed on the organic EL layer 130, since a portion formed on a region on which the conductive particle 150 does not exist is dense and the surface is flat (or substantially flat), that portion of the first metal layer 141 may not react with oxygen.

If a process time is lengthened and a ratio of oxygen (i.e., the range of 2% to 15% by volume) in an entire reaction gas contained in the chamber is high, the first metal layer 141 may react with oxygen to form the oxide layer on the surface. However, in an example embodiment of the present invention, conditions may be controlled to a range of 2% to 15% by volume of $O_2$ and approximately twenty (20) minutes of process time so as to not form the oxide layer on the first metal layer 141.

On the other hand, the surface of the conductive particle 150 may not be uniform, and so the portion 141a of the first metal layer 141 formed on the conductive particle 150 may have an irregular fabric and shape. More specifically, micro cracks 149 may occur on the portion 141a of the first metal layer formed on the conductive particle 150 having the irregular shape or on a region adjacent to the conductive particle 150 due to the irregular shape of the conductive particle 150.

Oxygen may penetrate to the conductive particle 150 through the micro cracks 149 formed on the portion 141a of the first metal layer 141 corresponding to the conductive particle 150. The penetrated oxygen may move along an interface (i.e., a micro space) between the irregular surface of the conductive particle 150 and the first metal layer 141. The oxygen may react with the metal material constituting the first metal layer 141 corresponding to the conductive particle 150.

Due to the reaction between the metal material constituting the first metal layer 141 and oxygen, the oxide layer 151 may form on the surface of the first metal layer 141 that contacts the conductive particle 150. The oxide layer 151 may exist on the interface between the conductive particle 150 and the first metal layer 141. A width (i.e., a dimension) of the oxide layer 151 may be smaller than a width of the first metal layer 141.

If the oxidation process is carried out in the chamber under a condition that a ratio of oxygen is more than 15% in volume, for twenty minutes or more, the oxygen may react with the metal material constituting the first metal layer 141. The oxide layer 151 may be formed on a region of the first metal layer 141 on which the particle 150 does not exist. Under the above condition, oxygen may penetrate to the organic EL layer 130 through various paths and the organic EL layer 130 may be oxidized.

Since the first metal layer 141 functions as a cathode electrode together with other metal layers formed in a stack on the first metal layer 141, the oxide layer 151 may have a significant influence on the function of the electrode if the oxide layer 151 is formed on the first metal layer 141.

On the other hand, if the oxidation process is carried out in a chamber such that a ratio of oxygen is less than 2% in volume for less than twenty minutes, the oxide layer 151 may not form on a flat surface (or shape) of first metal layer 141 or a thin oxide layer may be formed that does not influence the conductive function of the first metal layer 141. However, the oxide layer 151 with a sufficient thickness may not form on the interface between the conductive particle 150 and the first metal layer 141, and the oxide layer 151 may not prevent current from being leaked. Also, under the above condition, the oxidation process may be carried out for a long time (e.g., more than twenty minutes) to obtain the oxide layer with a sufficient thickness.

The first metal layer 141 may satisfy conditions in order to obtain an optimum effect in a process of forming the oxide layer 151 on an interface between the conductive particle 150 and the first metal layer 141.

The material for forming the first metal layer 141 may be one (or more) from a group consisting of aluminum, manganese, magnesium, calcium, and an alloy thereof that can react with oxygen as a reaction gas in the oxidation process. Accordingly, the oxide layer 151 formed on the interface between the conductive particle 150 and the first metal layer 141 may be aluminum oxide ($Al_2O_3$), manganese oxides ($MnO_x$), magnesium oxides ($MgO_x$) or calcium oxides ($CaO_x$). Other oxide layers are also within the scope of the present invention.

The first metal layer 141 may have a thickness in a range of from 1 nm to 100 nm. As another example, the first metal layer 141 may have a thickness in a range of from 60 nm to 70 nm. Other thicknesses and ranges are also within the scope of this disclosure.

If the thickness of the first metal layer 141 is less than 1 nm, oxygen may pass through the first metal layer 141 in the oxidation process and penetrate the organic EL layer 130. The organic EL layer 130 may be damaged by the oxygen.

On the other hand, if the thickness of the first metal layer 141 is more than 100 nm, oxygen may not pass through the first metal layer 141 or reach the conductive particle 150. Consequently, the oxide layer 151 may not be formed on the surface of the metal layer 141 contacting the conductive particle 150.

The oxidation process condition described above (i.e., the ratio of oxygen in the range of 2% to 15% by volume and the process time of twenty minute) is merely one example. Embodiments of the present invention are not limited thereto. For example, if the ratio of oxygen in the chamber in which the oxidation process is performed is more than 15% by volume, then the oxidation process time may be less than twenty minutes. On the other hand, if the ratio of oxygen in the chamber is less than 2% by volume, then the process time may be more than twenty minutes. Embodiments of the present invention may include other ratios and times.

Thus, the oxidation process conditions may be selected in various ranges considering factors such as the metal layer material on which the oxidation reaction occurs, a volume ratio of oxygen in the chamber in which the oxidation process is carried out, a process time, and/or a formation rate (i.e., thickness) of the oxide layer.

After performing the oxidation process, a second metal layer 142 (i.e., an upper metal layer or second conductive layer) constituting a lower metal layer may be formed on the first metal layer 141 as shown in FIG. 13B.

If the size of the conductive particle 150 is relatively small and the first metal layer 141 completely covers (or substantially covers) the entire surface of the conductive particle 150, the oxidation process may not be performed after forming the second metal layer 142 on the first metal layer 141.

The thickness of the oxide layer 151 formed around portions of the conductive particle 150 may be calculated or determined utilizing process conditions of the first oxidation process. The process conditions may include a volume ratio of oxygen, a process time, a reactivity of a material constituting the first metal layer 141 with oxygen, etc.

The thickness of the oxide layer 151 may be calculated by measuring leakage current to another device that occurs through the first oxidation process of a same condition or similar conditions. When compared with a device that does not include the oxidation process, if the leakage current of the device that includes the oxidation process is remarkably lower, the leakage current in the device caused by the conductive particle 150 may be significantly reduced through the first oxidation process.

If a leakage current caused by the conductive particle 150 is remarkably reduced by the oxide layer 151 formed on an interface between the conductive particle 150 and the first metal layer 141 by the first oxidation process, then the process for forming a third metal layer may be carried out without performing a second oxidation process.

Accordingly, due to the oxide layer 151 existing on the interface between the first metal layer 141 and the conductive particle 150, the conductive particle 150 may be electrically insulated from the first metal layer 141 and leakage current caused by the conductive particle 150 may not occur (or may be reduced). Also, the metal electrode 140 (including the plurality of metal layers 141 and 142) may have a relatively large thickness. Accordingly, a resistance of the metal electrode 140 may become smaller.

Here, as described above, a thickness of the first metal layer 141 to which oxygen penetrates in the oxidation process should be restricted (about 1 to 100 nm). However, in order to minimize a resistance and maintain a function of the metal electrode as the electrode, the metal electrode 140 must have a certain thickness. As shown in FIG. 13B, accordingly, compared with a restricted thickness of the first metal layer 141, the second metal layer 142 has a thickness which is the same as or thicker than that of the first metal layer 141 so that the metal electrode 140 consisting of the first metal layer 141 and the second metal layer 142 can perform naturally the function of the electrode and has a low resistance.

On the other hand, the first and second metal layers 141 and 142 constituting the metal electrode 140 may be formed of a same or similar metal material (e.g. aluminum, magnesium, calcium or alloy thereof). The first and second metal layers 141 and 142 may also be formed of different metal materials.

If the first and second metal layers 141 and 142 each are formed of different metal materials, an order for forming (i.e., stacking) the first and second metal layers 141 and 142 may be decided based on a work function of each metal material.

The work function may be a term representing energy required for discharging an electron at an absolute zero point in terms of an electron-volt (eV) unit. Energy such as heat or light may be applied to an electron in order to discharge the electron in the metal (or semiconductor) from a surface to an exterior.

The work function may depend on a kind of metal. For example, the work functions of sodium, barium, gold, platinum and tungsten may be 2.28 eV, 2.51 eV, 4090 eV, 5.32 eV and 4.52 eV, respectively. Accordingly, the arrangement of the first and second layers 141 and 142 discharging electrons may be decided after considering the work function of a metal material forming the metal layers.

As described above, on the other hand, in the oxidation process carried out after forming the first metal layer 141, the oxide layer 141b can be formed partially on a surface of the first metal layer 141. The oxide layer 141b formed on a surface of the first metal layer 141 can function as an insulating layer preventing an electric flow between the first metal layer 141 and the second metal layer 142 forming one metal electrode.

Accordingly, it is preferred that the oxide layer 141 is not formed on the first metal layer 141 or the oxide layer 141b has a minimum surface area. For example, the oxide layers 141b are formed such that a distance between the adjacent oxide layers 141b is 1 nm or more, and so an electric flow between the first metal layer 141 and the second layer 142 is not prevented and the metal electrode 140 can perform normally its function.

Here, by controlling the conditions (a volume ratio of oxygen and a process time) of the oxidation process, a distance between the adjacent oxide layers 141b corresponding with the above conditions can be obtained.

On the other hand, the method of manufacturing the display device (that is, the method of forming the metal electrode) according to the present invention may further comprise the step of applying an inverse bias voltage after a process of forming the oxide layer.

A great quantity of oxygen used for forming the oxide layer is existed in the chamber after the process of forming the oxide layer. Under this condition, if the inverse bias voltage is applied to the device, the micro crack 149 of the first metal layer 141 corresponding to the conductive particle 150 is expanded, and so oxygen existed in the chamber is introduced additionally into a space between the conductive particle 150 and the first metal layer 141 through the expanded micro crack 149. Consequently, in addition to the oxide layer 151 which is already formed on the first metal layer 141, the oxide layer with a sufficient thickness is additionally formed.

In the above description, although the step for applying the inverse bias voltage is performed after forming the oxide layer on the first metal layer 141, the inverse bias voltage can be applied in process of forming the oxide layer to obtain the same effect.

Figure 14A:
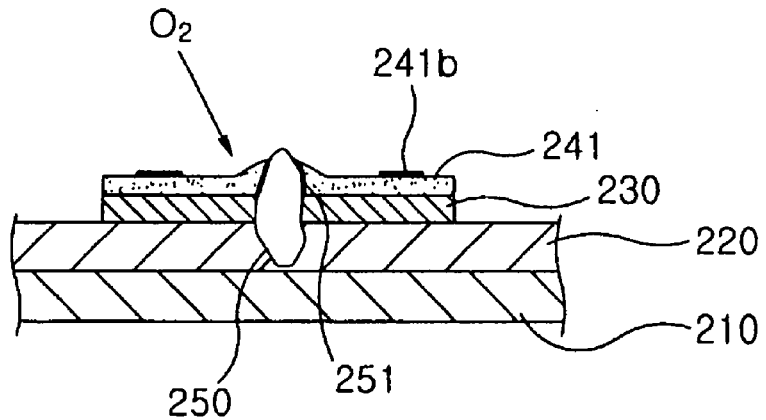
FIGS. 14A-14C are partial enlarged views showing (in sequence) a process of forming a cathode electrode in which a particle is not completely covered with a first metal layer according to an example embodiment of the present invention.
Figure 14B:
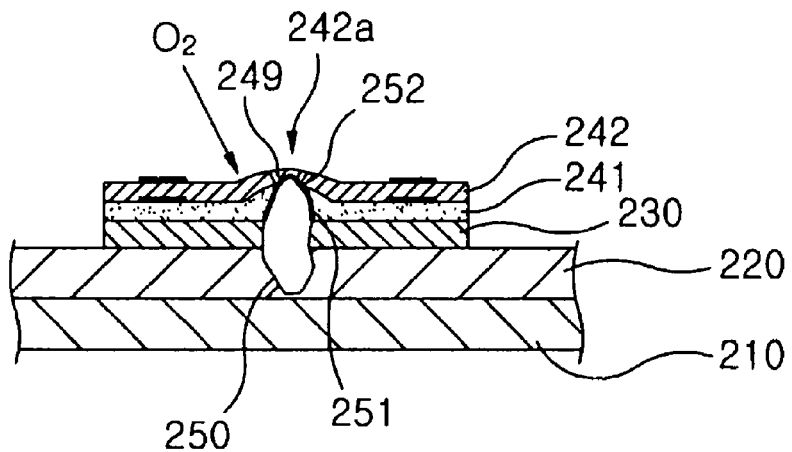
Figure 14C:
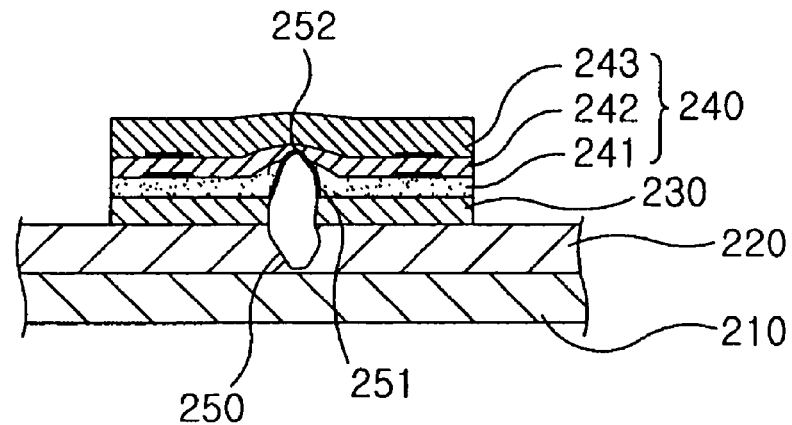

FIGS. 14A-14C are partial enlarged views showing (in sequence) a process of forming a metal electrode (i.e., a cathode electrode) in which a conductive particle is not covered completely by a first metal layer according to an example embodiment of the present invention. Other configurations and embodiments are also within the scope of the present invention.

If a size of the conductive particle 250 is relatively large, a first metal layer 241 (or first conductive layer) may be formed having a thickness as in the above described range (i.e., from 1 nm to 100 nm). However, the conductive particle 250 may not be completely covered by the first metal layer 241 and a portion thereof may be exposed outside of the first metal layer 241.

An oxide layer 251 (or insulating layer) formed by the first oxidation process (as described above with reference to FIG. 13A) may exist on the interface between the first metal layer 241 and the conductive particle 250. However, the oxide layer 251 may not exist on a surface of the conductive particle 250 exposed outside of the first metal layer 241. A width (i.e., a dimension) of the oxide layer 251 may be smaller than a width of the first metal layer 241.

A second metal layer 242 (or second conductive layer) formed on the first metal layer 241 may contact the exposed portion of the conductive particle 250 as shown in FIG. 14B. Leakage currents in the device that passes through the first oxidation process and leakage current in another device that does not pass through the oxidation process may not have much of a difference.

Although the first oxidation process may be carried out when the second metal layer 242 formed on the first metal layer 241 contacts the exposed portion of the conductive particle 250, leakage may also occur through the conductive particle 250. Accordingly, a second oxidation process may be performed.

After the first oxidation process, the second metal layer 242 constituting the lower metal layer may be formed on the first metal layer 241 through the metal layer forming process as shown in FIG. 14B.

Since the size of the conductive particle 250 may be large, a crack 249 may be formed on a portion 242a of the second metal layer 242 corresponding to the conductive particle 250.

After the process for forming the second metal layer 242, the second oxidation process may be carried out in a chamber having an oxygen atmosphere. The oxygen may penetrate through the crack 249 existing on a portion 242a of the second metal layer 242 corresponding to the conductive particle 250.

Oxygen may reach the conductive particle 250 and then react with metal material constituting the second metal layer 242 adjacent to the conductive particle 250 so as to form an oxide layer 252 (or insulating layer) on a surface of the second metal layer 242. The oxide layer 252 may exist on an interface between the second metal layer 242 and the conductive particle 250. A width of the oxide layer 252 may be smaller than a width of the second metal layer 242.

A third metal layer 243 (i.e., an upper metal layer) or third conductive layer may be formed on the second metal layer 242 through a metal layer forming process as shown in FIG. 13B. Accordingly, a multi-layered metal electrode 240 may be formed on the organic EL layer 230. The multi-layered metal electrode 240 may include the first and second metal layers 241 and 242 (as the lower metal layer) and the third metal layer 243 (as the upper metal layer).

A third oxidation process may be carried out in an oxygen chamber under a same condition as the first and second oxidation processes. On the other hand, if the current leakage is remarkably reduced or is not generated at all in the device through the first and second oxidation processes, the third oxidation process may not be carried out.

In the multi-layered metal electrode 240 (as shown in FIG. 14C) formed through the above processes, the conductive particle 250 may exist. However, oxygen may penetrate the first and second metal layers 241 and 242 and react with metal material constituting the first and second metal layers 241 and 242 corresponding to the conductive particle 250 in the first and second oxidation processes.

Accordingly, due to the oxide layer 251 existing on an interface between the first metal layer 241 and the conductive particle 250 and the oxide layer 252 existing on an interface between the second metal layer 242 and the conductive particle 250, the conductive particle 250 may be completely and electrically insulated from the first and second metal layers 241 and 242. Accordingly, leakage current caused by the conductive particle 250 may not occur and/or may be substantially reduced.

In at least one embodiment the oxidation process may be exemplified by the first oxidation process after forming the first metal layer 241 as the lower metal layer and the second oxidation process after forming the second metal layer 242. However, one oxidation process may be carried out after forming the lower metal layer including the first and second metal layers 241 and 242.

The metal layer forming process may be performed repeatedly (i.e., at least twice) to form the cathode (metal) electrode having a multi-layered structure, thereby making the cathode become thicker. As a result, embodiments of the present invention may reduce resistance of the cathode electrode.

In addition, since the oxidation process is carried out after forming the metal layer, the oxide layer may be formed around the conductive particle (i.e., on the interface between the conductive particle and the metal layer) and so leakage current by the conductive particle may be prevented and/or reduced.

Here, as described above, a thickness of the lower metal layer (that is, the first metal layer 241 and the second metal layer 242) to which oxygen penetrates in the oxidation process should be restricted. However, in order to minimize a resistance and maintain a function of the metal electrode as the electrode, the metal electrode 240 must have a certain thickness. As shown in FIG. 14C, accordingly, compared with a restricted thickness of the lower metal layer (the first metal layer 241 and the second metal layer 242), the third metal layer 243 (the upper metal layer) has a thickness which is the same as or thicker than that of the lower metal layer so that the metal electrode 240 consisting of the first, second and third metal layers 241, 242 and 243 can perform naturally the function of the electrode and has a low resistance.

On the other hand, the condition regarding a distance between the adjacent oxide layers formed on each of the first metal layer 241 and the second metal oxide layer 242 and the step for applying the inverse bias voltage after forming the oxide layer or in process of forming the oxide layer are the same as the condition regarding a distance between the adjacent oxide layers and the step for applying the inverse bias voltage in the above description described previously with reference to FIG. 13A and FIG. 13B.

Figure 15A:
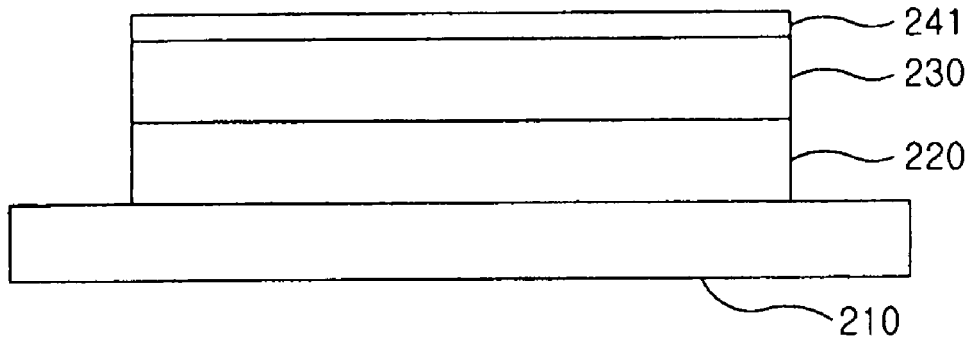
FIGS. 15A-15E show a process of forming a cathode electrode according to an example embodiment of the present invention.
Figure 15B:
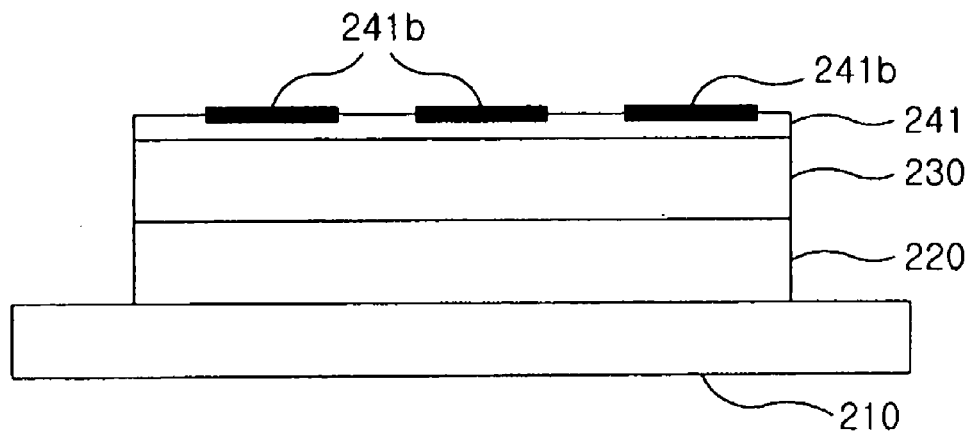
Figure 15C:
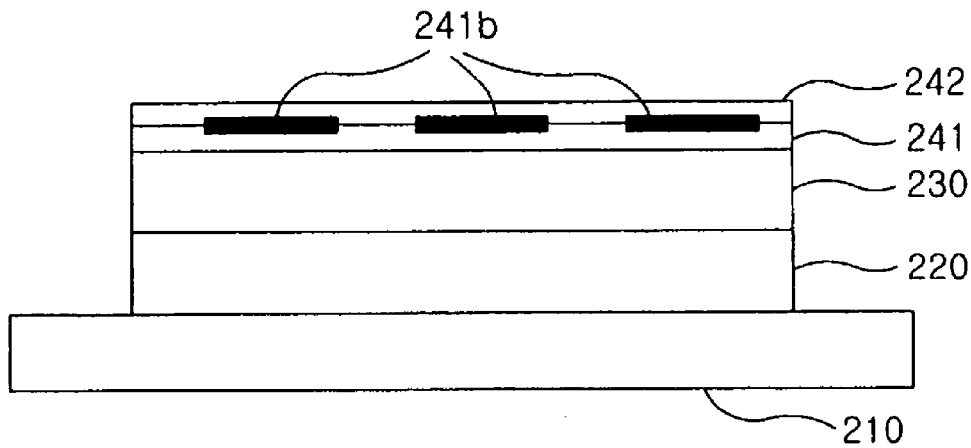

FIGS. 15A-15E show a process of forming a cathode electrode according to an example embodiment of the present invention. Other embodiments and configurations are also within the scope of the present invention. More specifically, in the absence of a conductive particle, the first metal layer 241 may be formed on the organic EL layer 230 as shown in FIG. 15A. FIG. 15B shows oxide layers 241b formed adjacent (or on) the first metal layer 241. FIG. 15C shows the second metal layer 242 formed on the first metal layer 241 and the oxide layers 241b.

Figure 15D:
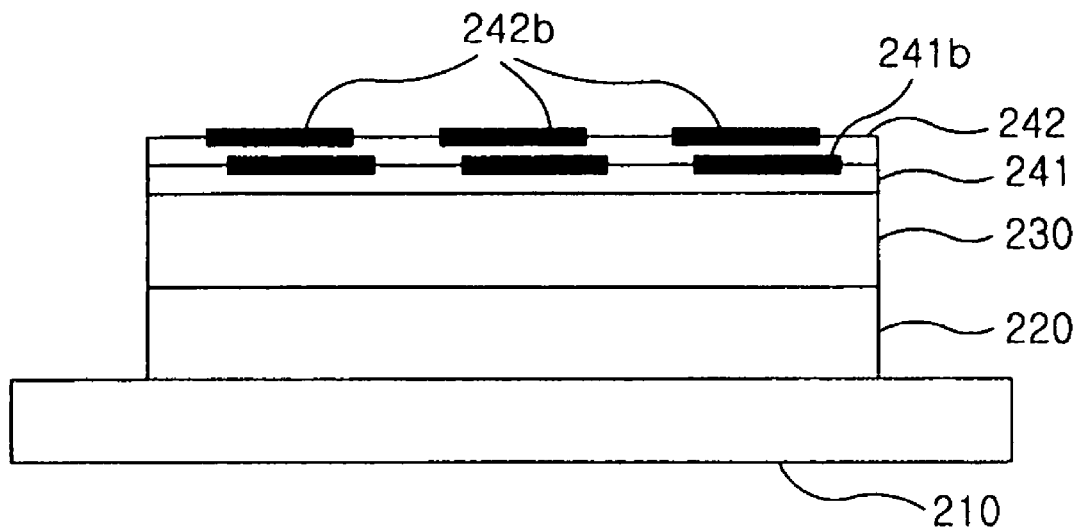
Figure 15E:
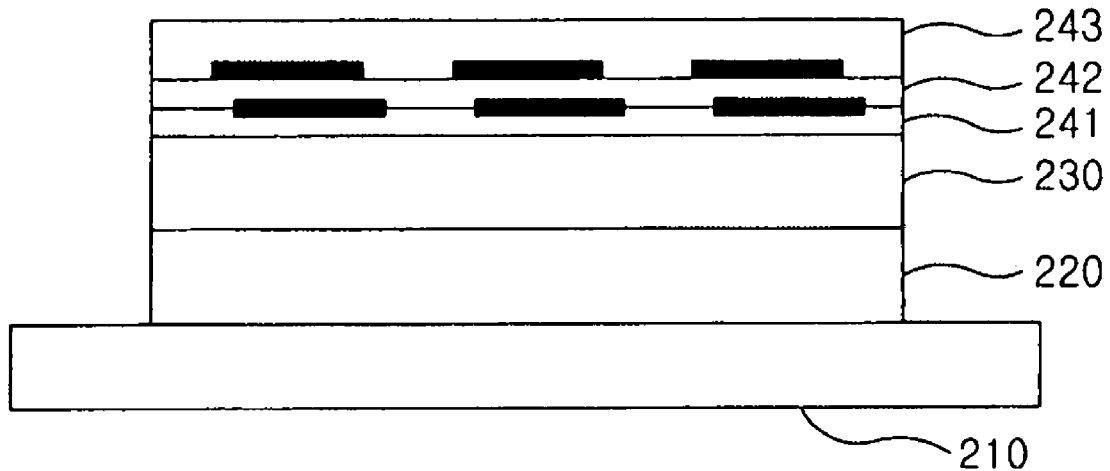

Additionally, FIG. 15D shows oxide layers 242b formed adjacent (or on) the second metal layer 242. FIG. 15E shows the third metal layer 243 formed on the second metal layer 242 and the oxide layers 242b.

Embodiments of the present invention may provide a display device in which a metal electrode is formed with a multi-metal layered structure to prevent (or reduce) generation of leakage current and reduce resistance of the metal electrode. While embodiments have been described with respect to three metal layers, other numbers of metal layers (or conductive layers) are also within the scope of the present invention.

Embodiments of the present invention may provide a method for manufacturing a display device wherein an oxide layer is formed on a periphery area of a conductive particle that may exist in a process of forming a metal electrode. The oxide layer may electrically insulate the conductive particle from the metal layer constituting the metal electrode and may prevent (or reduce) generation of leakage current caused by the conductive particle in the display device. The oxide layer may partially cover the organic EL layer such that the organic EL layer and the metal electrode contact each other at least one area not covered by the oxide layer.

While embodiments of the present invention have been described with respect to conductive particles, other types of particulars and/or materials may also be provided within the display device. Embodiments of the present invention are also applicable to these other particles and/or materials provided in the display device.

The electroluminescent device disclosed in various embodiments may be used in or formed as flexible display for electronic books, newspapers, and magazines, different types of portable devices, e.g., handsets, MP3 players, notebook computers, etc., vehicle audio applications, vehicle navigation applications, televisions, monitors, or other types of devices.

Any reference in this specification to "one embodiment," "an embodiment," "example embodiment," etc., means that a particular feature, structure, or characteristic described in connection with the embodiment is included in at least one embodiment of the present invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent device comprising:
a substrate;
a first electrode provided on the substrate;
a light emitting layer provided on the first electrode;
a second electrode provided on the light emitting layer, the second electrode including a first conductive layer of the electroluminescent device and a second conductive layer of the electroluminescent device on the first conductive layer; and
at least one first insulating layer formed on an upper surface of the first conductive layer of the first electroluminescent device, wherein the at least one first insulating layer includes a plurality of first insulating films spaced apart from one another on the upper surface of the first conductive layer, the plurality of first insulating films provided between the first conductive layer and the second conductive layer of the electroluminescent device,
wherein a portion of the upper surface of the first conductive layer of the electroluminescent device is not covered by the plurality of first insulating films of the at least one first insulating layer.

2. The electroluminescent device of claim 1, wherein the at least one first insulating layer is spaced apart from an adjacent first insulating layer by a distance of 1 nm or more.

3. The electroluminescent device of claim 1, wherein the at least one first insulating layer has a width less than the first conductive layer.

4. The electroluminescent device of claim 1, wherein the at least one first insulating layer has a thickness less than the first conductive layer.

5. The electroluminescent device of claim 1, wherein the second conductive layer has a thickness that is the same as or greater than a thickness of the first conductive layer.

6. The electroluminescent device of claim 1, further comprising at least one second insulating layer formed on an upper surface of the second conductive layer.

7. The electroluminescent device of claim 6, wherein the at least one second insulating layer comprises a plurality of second insulating films spaced apart from one another on the upper surface of the second conductive layer of the electroluminescent device.

8. The electroluminescent device of claim 7, wherein the at least one second insulating layer is spaced apart from an adjacent second insulating layer by a distance of 1 nm or more.

9. The electroluminescent device of claim 7, wherein the at least one second insulating layer has a width less than the second conductive layer.

10. The electroluminescent device of claim 1, wherein the second electrode further includes a third conductive layer on the second conductive layer.

11. The electroluminescent device of claim 10, wherein the third conductive layer has a thickness that is the same as or greater than the first and second conductive layers.

12. The electroluminescent device of claim 1, wherein the at least one first insulating layer comprises an oxide.

13. The electroluminescent device of claim 1, wherein the first conductive layer comprises a metal layer.

14. A method of forming an electroluminescent device comprising:
   forming a first electrode on a substrate;
   forming a light emitting layer on the first electrode;
   forming a second electrode on the light emitting layer, the second electrode including a first conductive layer and a second conductive layer on the first conductive layer; and
   forming at least one first insulating layer, wherein the at least one first insulating layer is formed on an upper surface of the first conductive layer, wherein the at least one first insulating layer includes a plurality of first insulating films spaced apart from one another on the upper surface of the first conductive layer, wherein the plurality of first insulating films is provided between the first conductive layer and the second conductive layer, and
   wherein a portion of the upper surface of the first conductive layer is not covered by the plurality of first insulating films of the at least one first insulating layer.

15. The method of claim 14, further comprising applying an inverse bias voltage after forming the first conductive layer.

16. The method of claim 14, wherein forming the at least one first insulating layer comprises forming the plurality of first insulating films on the first conductive layer.

17. The method of claim 14, further comprising forming a second insulating layer on an upper surface of the second conductive layer.

18. The method of claim 17, wherein forming the second insulating layer comprises forming a plurality of second insulating films spaced apart from one another on the upper surface of the second conductive layer.

19. The electroluminescent device of claim 1, wherein the first conductive layer has a thickness less than a thickness of the light emitting layer.

20. The electroluminescent device of claim 1, wherein the second electrode has a thickness greater than a thickness of the light emitting layer.

21. The electroluminescent device of claim 6, wherein the at least one second insulating layer has a thickness less than a thickness of the second conductive layer.

22. The electroluminescent device of claim 6, wherein the at least one second insulating layer comprises an oxide.

23. The electroluminescent device of claim 10, wherein the second electrode has a thickness greater than the light emitting layer.

* * * * *